(12) United States Patent
El Markhi et al.

(10) Patent No.: US 11,996,714 B2
(45) Date of Patent: *May 28, 2024

(54) BATTERY CHARGER

(71) Applicant: TEXAS INSTRUMENTS INCORPORATED, Dallas, TX (US)

(72) Inventors: Mustapha El Markhi, Richardson, TX (US); Alejandro Vera, Wylie, TX (US); Rohit Bhan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 107 days.

This patent is subject to a terminal disclaimer.

(21) Appl. No.: 17/558,100

(22) Filed: Dec. 21, 2021

(65) Prior Publication Data

US 2022/0115889 A1 Apr. 14, 2022

Related U.S. Application Data

(63) Continuation of application No. 16/354,962, filed on Mar. 15, 2019, now Pat. No. 11,239,680.

(Continued)

(51) Int. Cl.
*H02J 7/00* (2006.01)
*G01R 31/36* (2020.01)
*H02J 7/02* (2016.01)

(52) U.S. Cl.
CPC ......... *H02J 7/00304* (2020.01); *G01R 31/36* (2013.01); *H02J 7/00* (2013.01); *H02J 7/00712* (2020.01); *H02J 7/00714* (2020.01); *H02J 7/007192* (2020.01); *H02J 7/02* (2013.01); *H02J 7/00034* (2020.01); *H02J 2207/20* (2020.01)

(58) Field of Classification Search
USPC ....................................................... 320/137
See application file for complete search history.

(56) References Cited

U.S. PATENT DOCUMENTS

| 4,234,839 A | 11/1980 | King et al. |
| 5,029,266 A | 7/1991 | Bruce |

(Continued)

FOREIGN PATENT DOCUMENTS

| CN | 106936172 | 7/2017 |
| EP | 2908209 | 8/2015 |

(Continued)

OTHER PUBLICATIONS

Machine translation for RU260255, created Jun. 6, 2023, 10 pages.

*Primary Examiner* — Samuel Berhanu
(74) *Attorney, Agent, or Firm* — Ray A. King; Frank D. Cimino (57) ABSTRACT

A battery charger includes a battery power regulator configured to set a charge signal provided to a battery based on a charge control signal and charge enable signal. The battery charger also includes a controller configured to provide the charge control signal to the battery power regulator. The controller is also configured to temporarily de-assert the charge enable signal for a predetermined amount of time in response to determining that a change is needed in the charge control signal. The controller is further configured to re-assert the charge enable signal after the predetermined amount of time.

18 Claims, 8 Drawing Sheets

Related U.S. Application Data

(60) Provisional application No. 62/679,083, filed on Jun. 1, 2018.

(56) References Cited

U.S. PATENT DOCUMENTS

| | | | |
|---|---|---|---|
| 5,717,937 A | 2/1998 | Fritz | |
| 6,734,652 B1 | 5/2004 | Smith | |
| 9,696,782 B2 | 7/2017 | Ranveer et al. | |
| 10,044,214 B2 | 8/2018 | Yevgen | |
| 10,211,661 B2 | 2/2019 | Kim et al. | |
| 2010/0207571 A1* | 8/2010 | English | H01M 10/465 320/101 |
| 2001/0279096 | 11/2011 | Sonntag | |
| 2012/0105015 A1* | 5/2012 | Hermann | H02J 7/0031 320/164 |
| 2016/0137089 A1 | 5/2016 | Bo et al. | |
| 2016/0231801 A1 | 8/2016 | Ranveer et al. | |
| 2019/0023145 A1* | 1/2019 | Komiyama | H02J 7/00714 |

FOREIGN PATENT DOCUMENTS

| | | |
|---|---|---|
| RU | 260255 C1 | 5/2017 |
| WO | 2017164023 | 9/2017 |

\* cited by examiner

BATTERY CHARGER

CROSS-REFERENCE TO RELATED APPLICATION

This application is a continuation of U.S. application Ser. No. 16/354,962 filed Mar. 15, 2019, which claims the benefit of priority to U.S. Provisional Application No. 62/679,083, filed Jun. 1, 2018, the entireties of both of which are herein incorporated by reference.

TECHNICAL FIELD

This relates generally to electronic circuitry, and more particularly to systems and methods for charging a battery.

BACKGROUND

A battery charger, or recharger, is a device used to put energy into a battery by forcing an electric current through the battery. A charging protocol of the battery indicates a voltage and/or current level, a duration, and what operations are executed when charging is complete. The charging protocol of the battery depends on the size and type of the battery being charged. Some battery types have high tolerance for overcharging (e.g., continued charging after the battery has been fully charged) and are rechargeable via connection to a constant voltage source or a constant current source. Some battery chargers employ a timer to cut off charging current at some fixed time, approximately when charging is complete. Other battery types cannot withstand overcharging, being damaged (reduced capacity, reduced lifetime), over heating or even exploding. Thus, the charger for such battery types includes a temperature and/or voltage sensing circuits and a microprocessor controller to safely adjust the charging current and voltage, determine the state of charge, and cut off at the end of a charge.

In electrical engineering, spikes are fast, short duration electrical transients in voltage (voltage spikes), current (current spikes), or transferred energy (energy spikes) in an electrical circuit. Excessive electric current during such a spike may destroy or severely weaken an electronic device.

SUMMARY

In a first example, a battery charger includes a battery power regulator configured to set a charge signal provided to a battery based on a charge control signal and charge enable signal. The battery charger also includes a controller configured to provide the charge control signal to the battery power regulator and temporarily de-assert the charge enable signal for a predetermined amount of time in response to determining that a change is needed in the charge control signal. The controller is also configured to re-assert the charge enable signal after the predetermined amount of time.

In a second example, a system includes a power regulator configured to provide power for charging a battery. The system also includes a battery power regulator configured to receive the power for charging the battery and set a charge signal provided to a battery based on a charge control signal and a charge enable signal. The system further includes a controller configured to provide the charge control signal to the battery power regulator based on a charge command signal received at the controller. The controller is also configured to temporarily de-assert the charge enable signal for a predetermined amount of time in response to the charge command signal commanding a change in the charge control signal, wherein de-assertion of the charge enable signal causes the battery power regulator to disable the charge signal. The controller is further configured to change the charge control signal based on the change in the charge command signal and re-assert the charge enable signal after the predetermined amount of time. The re-assertion causes the battery power regulator to re-enable the charge signal.

In a third example, a method for charging a battery includes applying, by a battery power regulator, a first charge signal to a battery based on a charge control signal and assertion of a charge enable signal. The method also includes determining, by a controller, that the charge control signal is to change and de-asserting, by the controller, the charge enable signal based on the determining, thereby causing the battery power regulator to disable the first charge signal. The method further includes changing, by the controller, the charge control signal in response to the de-asserting and re-asserting, by the controller, the charge enable signal a predetermined amount of time after the changing. The method yet further includes applying, by the battery power regulator, a second charge signal to the battery based on the changed charge control signal and the re-assertion of the charge enable signal.

DETAILED DESCRIPTION

The present disclosure relates to systems and methods for charging a battery. In some examples, a battery power regulator applies a charge signal to the battery based on a charge control signal and the assertion of a charge enable signal provided by a controller. The charge control signal and the charge enable signal are based on a charge command signal provided from an external system or based on internal logic of the controller. Moreover, the controller determines that the charge control signal is to change. The determination is made based on a change in the charge command signal provided from the external system.

In some battery charging systems, the controller abruptly changes the control signal, which in turn changes the internal logic of the battery power regulator. This abrupt change in the control signal causes a transient spike in a current of the charge signal. This transient spike exceeds a safety threshold of the battery, such that the transient spike shortens the life of the battery. Thus, the transient spike in the current of the charge signal is a problem that needs addressed.

As a solution to problems associated with an abrupt change in the control signal, which causes the aforementioned transient spikes in the current of the charge signal, the controller temporarily de-asserts the charge enable signal prior to changing the charge control signal. More particularly, in situations where the controller determines that the charge control signal is to change, the controller temporarily de-asserts the charge enable signal for a predetermined amount of time (e.g., about 10 microsecond (μs) to about 500 milliseconds (ms)), thereby causing the battery power regulator to reduce the current of the charge signal to near 0 A (e.g., +/−0.001 A). About 1 μs to about 1 ms after de-asserting the charge enable signal the controller changes the charge control signal, thereby causing the battery power regulator to adjust internal circuitry (e.g., switches) for outputting a changed charge control signal during the predetermined amount of time. That is, the de-asserting of the charge signal leads the change to the charge control signal. After the predetermined amount of time, the controller re-asserts the charge enable signal. In response, the battery power regulator applies the changed charge signal to the battery based on the changed charge control signal. In this manner, the charge signal applied to the battery remains at or below a safety threshold before, during and after the controller changes the charge control signal. Accordingly, transient spikes in the charge signal due to changes in the adjustments to the internal circuitry in the battery power regulator are curtailed and/or eliminated.

Figure 1:
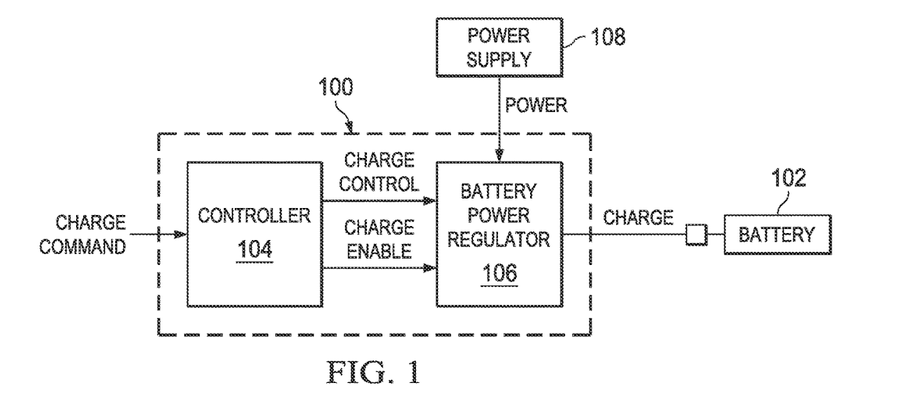
FIG. 1 is a diagram of an example of a system for charging a battery.

FIG. 1 is a block diagram of a system 100 for charging a battery 102 that avoids the aforementioned transient spikes in a current of a charge signal, CHARGE. In some examples, the system 100 is representative of a battery charger. The system 100 is implemented, in some examples, as an integrated circuit (IC) chip, or a plurality of IC chips mounted on a circuit board operating in concert. As one example, the system 100 is implemented on a mobile device, such as a smart phone, etc. As another example, the system 100 is implemented on a battery operated internet of things (IoT) device. However, the system 100 is alternatively utilizable in any system that charges a battery.

In some examples, the system 100 includes a controller 104 that provides a charge control signal, CHARGE CONTROL to a battery power regulator 106. As explained herein, the charge control signal, CHARGE CONTROL controls a current and/or a voltage of a charge signal, CHARGE as output by the battery power regulator 106 to the battery 102. In some examples, the charge control signal, CHARGE CONTROL is a digital signal, such as a multibit word signal. In other examples, the charge control signal, CHARGE CONTROL is an analog signal. The controller 104 also provides a charge enable signal, CHARGE ENABLE to the battery power regulator 106. The battery power regulator 106 receives a power signal, POWER from a power supply 108 (e.g., a regulated power supply) and provides the charge signal, CHARGE that varies based on the charge control signal, CHARGE CONTROL and the charge enable signal, CHARGE ENABLE.

In some examples, the controller 104 receives a charge command signal, CHARGE COMMAND from an external source, such as a microcontroller or general processing unit operating on a system that is powered by the battery 102. In such situations, the charge command signal, CHARGE COMMAND includes data identifying a level of charge and/or a level of charge for the battery 102. In this configuration, the charge control signal, CHARGE CONTROL varies as a function of the charge command signal, CHARGE COMMAND. In other examples, the controller 104 generates the charge control signal, CHARGE CONTROL without input from any external source.

Figure 2:
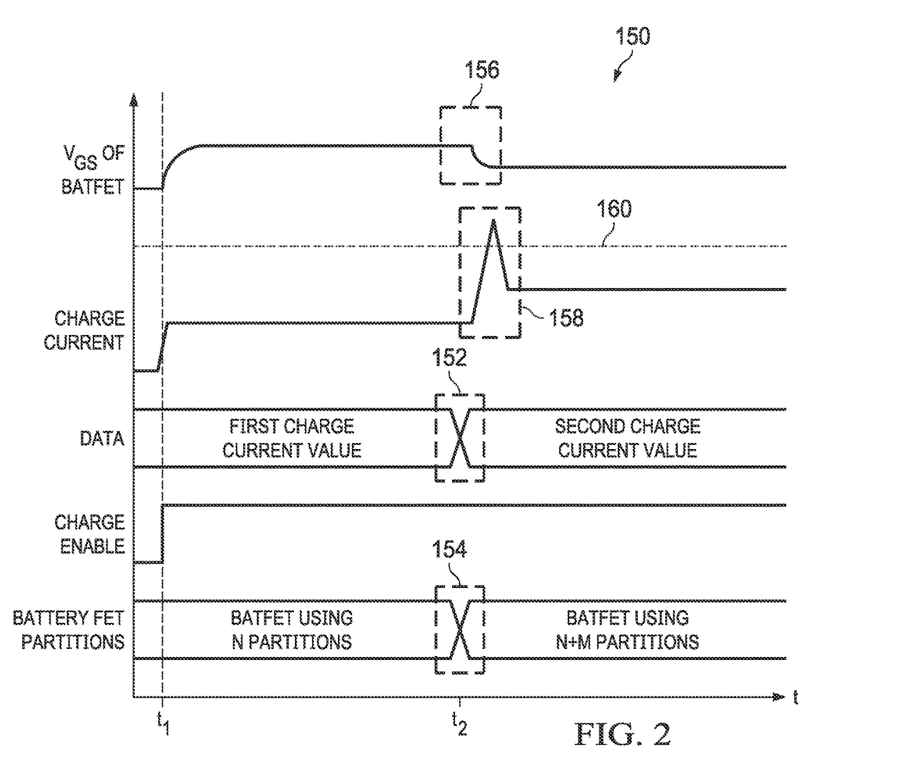
FIG. 2 illustrates a graph that plots a charge enable signal, a data signal, a charge signal, a gate to source voltage of a battery field effect transistor (FET), and a number of battery FET partitions as a function of time.

FIG. 2 illustrates an example of a graph 150 that demonstrates problems addressed by the system 100 of FIG. 1. The graph 150 plots a current of a charge signal, CHARGE CURRENT, a data signal, DATA and a charge enable signal, CHARGE ENABLE as a function of time. Additionally, the graph 150 also includes plots a gate to source of a battery FET, $V_{GS}$ of BATFET (e.g., a gate to source transistor that supplies the charge signal to a battery). As illustrated at time, $t_1$, assertion of the charge enable signal, CHARGE ENABLE causes a battery power regulator to provide the charge signal to the battery at a first charge level based on a first charge signal value embedded in the data signal, DATA. Additionally, as indicated at 152, the data signal, DATA changes from the first charge signal value to a second charge signal value.

In response to the change in the data signal, DATA change at 152 from the first charge signal value to the second charge signal value, at time $t_2$, as indicated by 154, the number of battery FET partitions changes from N number of number of battery FET partitions to N+M number of battery FET partitions, where N and M are integers greater than or equal to one. The abrupt change in the number of battery FET partitions corresponds to a transient drop 156 in the gate to source of a battery FET, $V_{GS}$ of BATFET. Moreover, the transient drop 156 in the gate to source of a battery FET, $V_{GS}$ of BATFET causes a transient spike 158 in the current of the charge signal, CHARGE CURRENT. This transient spike 158 in the current of the charge signal, CHARGE CURRENT damages the battery over time. That is, the transient spike 158 is an undesirable problem that occurs without control of the charge enable signal, CHARGE ENABLE. In particular, the transient spike 158 exceeds a safety threshold 160 for the battery (e.g., a level that would not damage the battery). Further, the greater number of transitions of the charge signal value, the greater the number of instances of the spike 158, which reduces a life of the battery.

Referring back to FIG. 1, to solve the problem presented in FIG. 2 (namely, the transient spike 158), the battery power regulator 106 is configured such that if the charge enable signal, CHARGE ENABLE is asserted (e.g., active high or active low, depending on the design of the system), the battery power regulator 106 supplies the charge signal, CHARGE to the battery 102 based on the charge control signal, CHARGE CONTROL. Conversely, if the charge enable signal, CHARGE ENABLE is de-asserted (e.g., active low or active high), the battery power regulator 106 disables the charge signal, CHARGE for the battery 102, such that the current charge signal, CHARGE is at or near 0 A (e.g., +/−0.001 A).

The controller 104 is configured to adjust the charge enable signal, CHARGE ENABLE, in a situation where the charge control signal, CHARGE CONTROL is to be changed to indicate change a level (a current and/or a voltage) of the charge signal, CHARGE such as in response to a change in the charge command signal, CHARGE COMMAND. Further, prior to changing the charge control signal, CHARGE CONTROL, the controller 104 temporarily de-asserts the charge enable signal, CHARGE ENABLE to disable the charge signal, CHARGE for a predetermined amount of time (e.g., about 10 μs to about 500 ms). About 1 μs to about 1 ms after the de-assertion of the charge enable signal, CHARGE ENABLE, the controller 104 changes the charge control signal, CHARGE CONTROL. Stated differently, the de-assertion of the charge enable signal, CHARGE ENABLE preempts the change to the charge control signal, CHARGE CONTROL. The predetermined amount of time is implemented as a delay relative to the change indicated in the charge command signal, CHARGE COMMAND, and the predetermined amount of time is tracked with a timer of the controller 104. This temporary de-assertion of the charge enable signal, CHARGE ENABLE causes the battery power regulator 106 to correspondingly temporarily disable the charge signal, CHARGE. During the temporary disabling of the charge signal, CHARGE, the battery power regulator 106 adjusts internal circuitry (e.g., switches) to adjust internal current flow in response to the change in the charge control signal, CHARGE CONTROL, and such changes to the internal current flow avoids transient spikes in the current of the charge signal, CHARGE. More particularly, as discussed herein, the adjustment of the internal current flow adds or removes partitions of transistors that are employed to supply the charge signal, CHARGE.

Upon the controller 104 re-asserting the charge enable signal, CHARGE ENABLE, the battery power regulator 106 reactivates the charge signal, CHARGE, such that the charge signal, CHARGE is adjusted to a level as indicated by the charge control signal, CHARGE CONTROL. Accordingly, before, during and after a change in the charge control signal, CHARGE CONTROL, the current of the charge signal, CHARGE remains at or below a safety threshold (e.g., a level that would not damage the battery 102) for the battery 102. In this manner, transient spikes in the charge signal, CHARGE due to a change in the flow of current through the internal circuitry of the battery power regulator 106 in response to a change in the charge control signal, CHARGE CONTROL are curtailed and/or eliminated. Thus, damage to the battery 102 from such transient spikes is reduced and/or eliminated. Advantageously, the present disclosure introduces a solution that extends the life of the battery 102, which may be measured by the number of charge/discharge cycles possible before cells of the battery 102 fails to operate satisfactorily.

Figure 3:
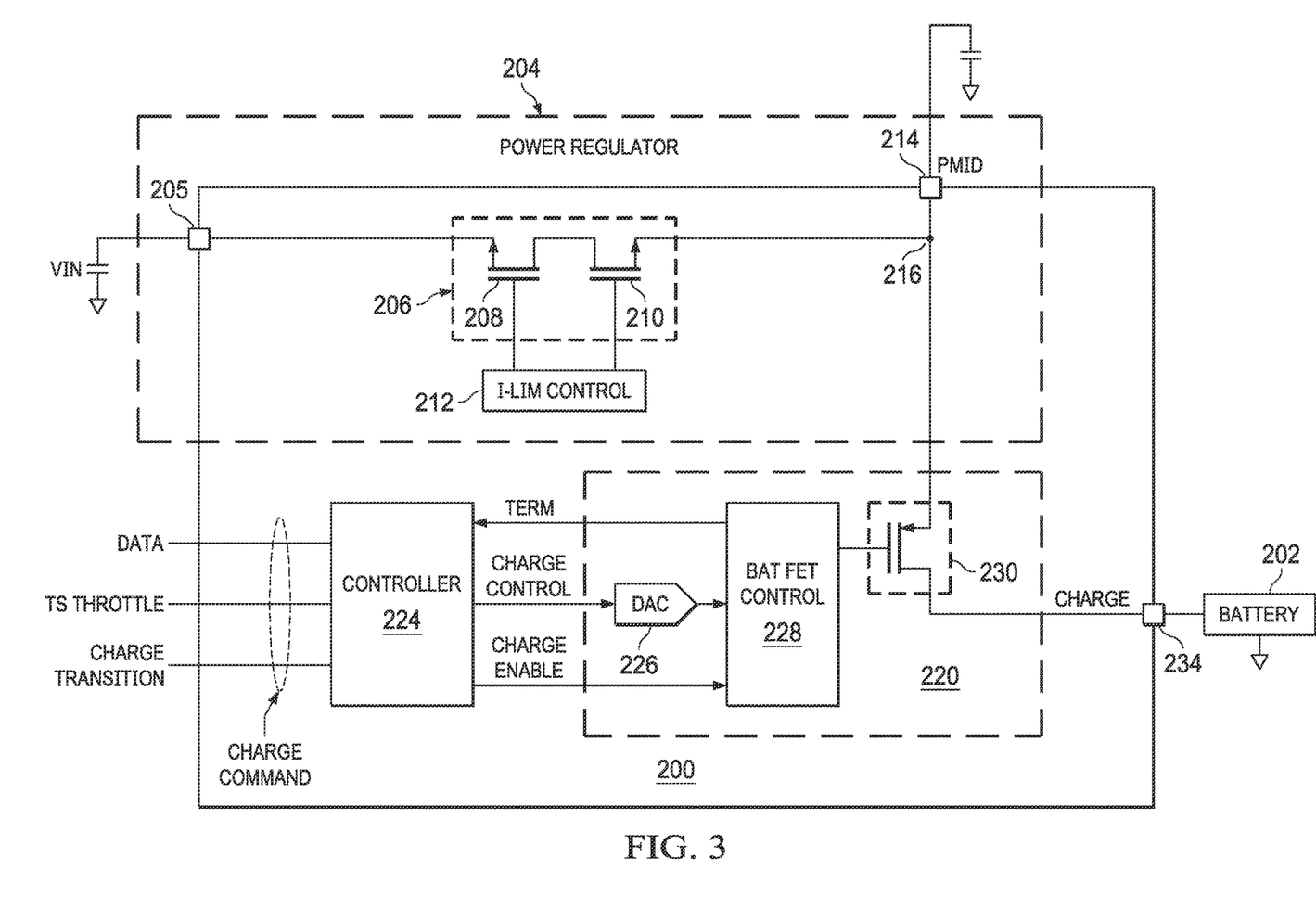
FIG. 3 is a diagram of another example of a system for charging a battery.

FIG. 3 illustrates another example of a system 200 for charging a battery 202 that avoids the aforementioned transient spike in a current of a charge signal, CHARGE. The system 200 is implemented as an IC chip or as a plurality of IC chips mounted on a circuit board operating in concert. As one example, the system 200 is implemented on a mobile device, such as a smart phone. As another example, the system 200 is implemented on a battery operated IoT device. However, the system 200 is utilizable in any system that is powered by a battery.

The system 200 includes a power regulator 204 that could be employed to receive a power signal from a power supply (e.g., the power supply 108 of FIG. 1). In some examples, the power regulator 204 includes an input voltage rail, VIN that provides a direct current (DC) voltage signal at an input voltage terminal 205 to a current limiting module 206. The input voltage terminal 205 is coupled to an output node of the power supply. The current limiting module 206 is formed by a first n-channel metal oxide semiconductor field effect transistor (NMOS) 208 and a second NMOS 210. More particularly, a source of the NMOS 208 is coupled to the input voltage terminal 205, and drains of the NMOS 208 and the NMOS 210 are coupled together. The gates of the NMOS 208 and the NMOS 210 are coupled to a current limiting controller 212. The current limiting controller 212 is implemented as an analog control loop. The current limiting controller 212 is programmed/configured to control a voltage level of the gates of the NMOS 208 and the NMOS 210 to limit current flow through the current limiting module 206. A source of the NMOS 210 is coupled to a midpoint power terminal 214 via a node 216. The node 216 is coupled to the battery power regulator 220. The battery power regulator 220 is employed to implement the battery power regulator 106 of FIG. 1.

The system 200 also includes a controller 224 that provides a charge control signal, CHARGE CONTROL and a charge enable signal, CHARGE ENABLE to the battery power regulator 220. The battery power regulator 220 is implemented as a digital core processor. The charge control signal, CHARGE CONTROL is an M-bit digital signal, where M is an integer greater than or equal to two (2).

The controller 224 includes internal logic for generating the charge control signal, CHARGE CONTROL and the charge enable signal, CHARGE ENABLE. In other examples, the controller 224 receives a charge command signal, CHARGE COMMAND from an external source, such as a processor. The charge command signal, CHARGE COMMAND is representative of a composite signal formed of a plurality of individual signals from the external source.

The charge command signal, CHARGE COMMAND includes a data signal, DATA that characterizes a level of a charge signal, CHARGE provided to a battery 202. In some examples, the data signal, DATA indicates a level of a current in the charge signal, CHARGE. In other examples, the, DATA indicates a level of a voltage in the charge signal, CHARGE. The level of the charge signal, CHARGE indicated by the data signal, DATA is changeable over time, such that the data signal, DATA provides the controller 224 with values for the charge signal, CHARGE that increase or decrease based on a state of the battery 202. For instance, the level of the charge signal, CHARGE indicated by the data signal, DATA is reduced in a situation where the battery 202 is nearly fully charged. Conversely, the level of the charge signal, CHARGE indicated by the data signal, DATA is raised from a pre-charge level to a fast charge level in after the battery 202 is partially charged. The data signal, DATA is provided via a standard bus, such as an I²C bus. The charge command signal, CHARGE COMMAND also include a temperature sensor throttle signal, TS THROTTLE that is asserted in the event a detected temperature of the battery 202 exceeds a threshold. The charge command signal, CHARGE COMMAND also includes a charge transition signal, CHARGE TRANSITION that is asserted to switch charging of the battery from a pre-charge operation to a fast charge operation.

The battery power regulator 220 includes a digital to analog converter (DAC) 226 that converts the charge control signal, CHARGE CONTROL from a digital signal to an analog signal that is provided to a battery field effect transistor (FET) control 228. The battery FET control 228 is implemented as a network of switches that control an array of FETs illustrated as a single FET 230 for the sake of simplicity. That is, the battery FET control 228 controls a state of the array of FETs that are illustrated as the single FET 230. Moreover, the battery power regulator 220 provides a termination feedback signal, TERM that (if asserted) requests that the charge signal, CHARGE be disabled due to an state of charge of the battery 202 reaching a maximum or near maximum level indicating that the battery 202 is fully charged.

The midpoint power terminal 214 has a voltage level, PMID of about the voltage level of the input voltage rail, VIN minus a voltage drop across the current limiting module 206, which is equal to the current across the current limiting module 202, $I_{ILIM}$ times the resistance across the current limiting module 206 $R_{ILIM}$ in situations where the input voltage rail, VIN is greater than 0. Additionally, the voltage at the midpoint power terminal 214, PMID is about equal to a voltage of the battery 202, VBAT minus the voltage drop across the transistor array 230 in situations where the input voltage rail, VIN is near 0 V, such as situations where the system 200 is operating on an electronic device that is unplugged or otherwise disconnected from an external power source or in situations where a power supply is experiencing a fault. In such an situation (the input voltage rail, VIN is near 0 V), the voltage drop across the transistor array 230 is about equal to current of the battery, $I_{BAT}$ times a drain to source resistance across the transistor array 230, $R_{DSARRAY}$ (presuming that at least one transistor in the transistor array 230 is turned on). Accordingly, the voltage at the midpoint power terminal, PMID is provided by Equation 1.

$$PMID \approx \begin{cases} VIN - I_{LIMI} * R_{ILIM}, & VIN > 0 \\ V_{BAT} - I_{BAT} * R_{DSARRAY}, & VIN = 0 \end{cases} \quad \text{Equation 1}$$

The controller 224 examines the charge command signal, CHARGE COMMAND and the terminating signal, TERM to generate the charge control signal, CHARGE CONTROL. The charge control signal, CHARGE CONTROL causes the battery power regulator 220 to output a charge signal, CHARGE (e.g., signal with controlled current and/or controlled voltage) to the battery 202 at a level as indicated by charge control signal, CHARGE CONTROL. However, the controller 224 is configured such that if the charge enable signal, CHARGE ENABLE is de-asserted, the current of the charge signal, CHARGE drops to a level near 0 A (e.g., +/−0.001 A) independently of the charge control signal, CHARGE CONTROL.

The controller 224 is configured to set the charge control signal, CHARGE CONTROL based on the data signal, DATA. Moreover, the controller 224 is configured to adjust the charge control signal, CHARGE CONTROL based on changes to the data signal, DATA. Additionally, the controller 224 is configured to adjust the charge control signal, CHARGE CONTROL based on the temperature sensor throttle, TS THROTTLE the charge transition signal, CHARGE TRANSITION and/or the termination signal, TERM. In this manner, the external system is able to utilize nearly any recharging algorithm and/or protocol to recharge the battery 202.

The battery power regulator 220 is configured to generate a charge signal, CHARGE that is applied to a battery terminal 234 based on the charge control signal, CHARGE CONTROL and assertion of the charge enable signal, CHARGE ENABLE. More particularly, if the charge enable signal, CHARGE ENABLE is asserted, the DAC 226 provides an analog signal to the battery FET control 228 that causes the battery FET control 228 to adjust internal circuitry (e.g., switches, as explained herein) that controls a state of the transistor array 230. The transistor array 230 generates the charge signal, CHARGE for the battery 202. However, if the charge enable signal, CHARGE ENABLE is not asserted, the battery FET control 228 turns off each transistor in the transistor array 230, such that the charge signal CHARGE applied to the battery 202 is nearly 0 A (e.g., +/−0.001 A).

The controller 224 is configured to temporarily de-assert the charge enable signal, CHARGE ENABLE prior to changing the charge control signal, CHARGE CONTROL for a predetermined amount of time. The predetermined amount of time can be a delay based on a timer of the controller 224. Thus, prior to changing the charge control signal, CHARGE CONTROL, the charge enable signal, CHARGE ENABLE is de-asserted for the predetermined amount of time, and re-asserted after the predetermined amount of time. The predetermined amount of time enables battery FET control 228 to make adjustments to internal logic components to avoid transient spikes in the charge signal, CHARGE. More particularly, during the predetermined amount of time, the battery FET control 228 adjusts switches that control the transistor array 230, such that transient currents from a change in states of the switches are not applied to the charge signal, CHARGE for the battery 202. Accordingly, before, during and after a change in the charge control signal, CHARGE CONTROL the charge signal, CHARGE remains at or below a safety threshold for the battery 202.

Figure 4:
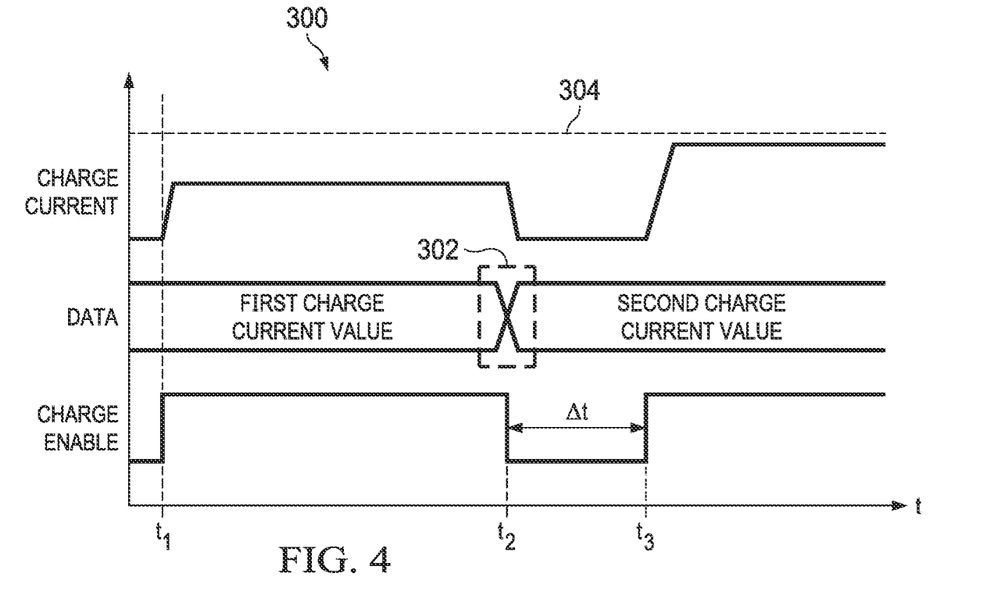
FIG. 4 illustrates a graph that plots a charge enable signal, a data signal and a current of a charge signal as a function of time.

FIG. 4 illustrates a graph 300 that plots an example of a controlled current of a charge signal, CHARGE CURRENT, a data signal, DATA and a charge enable signal, CHARGE ENABLE of FIG. 3 as a function of time. As illustrated at time, assertion of the charge enable signal, CHARGE ENABLE causes the battery power regulator 220 to provide a charge signal, with the controlled charge current, CHARGE CURRENT to the battery 202 at a first charge current level based on a first charge current value embedded in the data signal, DATA. Additionally, as indicated at 302, the data signal, DATA changes from the first charge current value to a second charge current value.

In response to the data signal, DATA change at 302 from the first charge current value to the second charge current value, at time $t_2$, the controller 224 de-asserts the charge enable signal, CHARGE ENABLE for a predetermined amount of time, $\Delta t$, such as about 10 µs to about 500 ms. In response, the current of the charge signal, CHARGE CURRENT drops to a level near 0 A (e.g., +/−0.001 A). About 1 µs to about 1 ms after the de-assertion of the charge enable signal, CHARGE ENABLE, the controller 224 changes the charge control signal (CHARGE CONTROL of FIG. 3). Thus, as noted, during the predetermined amount of time, $\Delta t$, the battery power regulator 220 adjusts internal switching in response to the change in the charge control signal (CHARGE CONTROL of FIG. 3) to avoid transient spikes in the current of the charge signal, CHARGE CURRENT. At time, $t_3$, the charge enable signal, CHARGE ENABLE is re-asserted and the current of the charge signal, CHARGE CURRENT rises from the level near 0 A (e.g., +/−0.001 A) to a second charge current level. Moreover, before, during and after changing from the first charge current value to the second charge current value, the current of the charge signal, CHARGE CURRENT remains below a safety threshold 304 of the battery 202.

Figure 5:
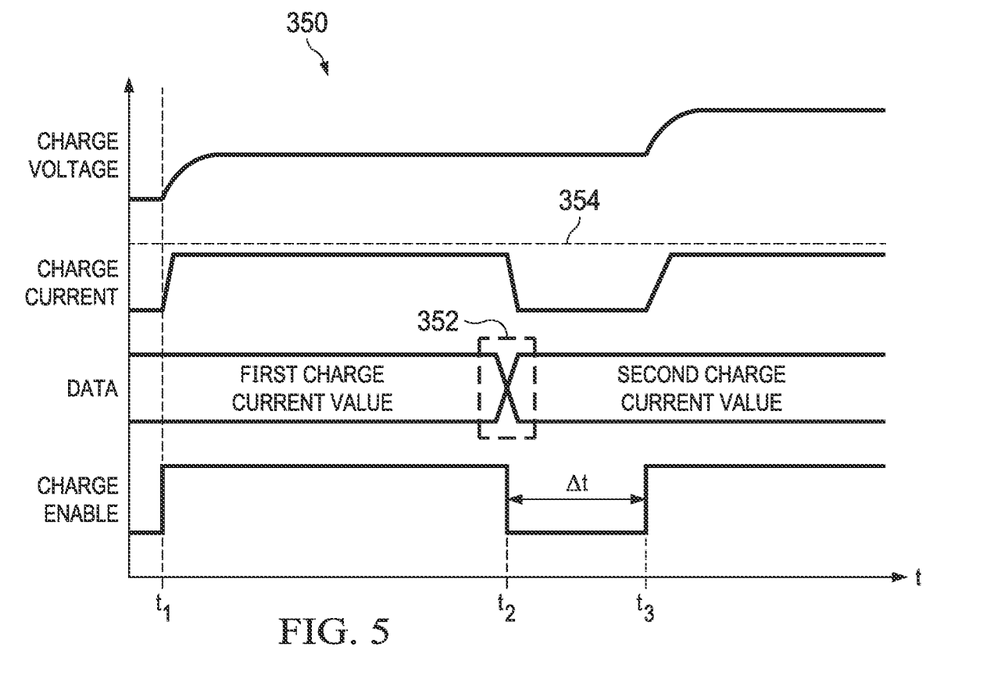
FIG. 5 illustrates a graph that plots a charge enable signal, a data signal a current of a charge signal and a voltage of the charge signal as a function of time.

FIG. 5 illustrates a graph 350 that plots an example of a current of a charge signal, CHARGE CURRENT, a controlled voltage of the charge signal, CHARGE VOLTAGE (a battery voltage), a data signal, DATA and a charge enable signal, CHARGE ENABLE of FIG. 3 as a function of time. As illustrated at time, assertion of the charge enable signal, CHARGE ENABLE causes the battery power regulator 220 to provide a charge signal, with a controlled charge voltage, CHARGE VOLTAGE to the battery 202 at a first voltage level based on a first charge voltage value embedded in the data signal, DATA. Additionally, as indicated at 352, the data signal, DATA changes from the first charge voltage value to a second voltage signal value.

In response to the data signal, DATA change at 352 from the first charge voltage value to the second charge voltage value (indicating a change in the voltage of the charge voltage, CHARGE VOLTAGE), at time $t_2$, the controller 224 de-asserts the charge enable signal, CHARGE ENABLE for a predetermined amount of time, Δt, such as about 10 μs to about 500 ms. In response, the current of the charge signal, CHARGE CURRENT drops to a level near 0 A (e.g., +/−0.001 A). About 1 μs to about 1 ms after the de-assertion of the charge enable signal, CHARGE ENABLE, the controller changes the charge control signal (CHARGE CONTROL of FIG. 3). As noted, during the predetermined amount of time, Δt, the battery power regulator 220 adjusts internal switching in response to the charge control signal (CHARGE CONTROL of FIG. 3) to avoid transient spikes in the current of the charge signal, CHARGE CURRENT. At time, $t_3$, the charge enable signal, CHARGE ENABLE is re-asserted and the current of the charge signal, CHARGE CURRENT rises from the level near 0 A (e.g., +/−0.001 A) and returns to the previous level (the level prior to the de-assertion of the charge enable signal, CHARGE ENABLE. Additionally, at time, $t_3$, the charge voltage level raises from the first charge voltage level to a second charge voltage level. Moreover, before, during and after changing from the charge voltage value to the second charge voltage value, the current of the charge signal, CHARGE remains below a safety threshold 354 for the battery 202.

Referring back to FIG. 3, as one example, in operation, the system 200 sets a pre-charge charge level (e.g., an initial charge level) level in a first charging state. In the first charging state, the battery power regulator 220 applies a first charge signal, CHARGE to the battery 202. Additionally, at some point, the charge command signal, CHARGE COMMAND provides an indication that the charge signal, CHARGE (e.g., via the data signal, DATA) to change. In response, the system 200 changes to a transition state. In the transition state, the controller 224 de-asserts the charge enable signal, CHARGE ENABLE for a predetermined amount of time, and changes the charge control signal, CHARGE CONTROL. In response, the battery power regulator 220 disables the charge signal, CHARGE and changes internal circuitry (e.g., switches) corresponding to the change in the charge control. After the predetermined amount of time, the system 200 operates in a second charging state, wherein the charge enable signal, CHARGE ENABLE is re-asserted. Re-assertion of the charge enable signal, CHARGE ENABLE causes the battery power regulator 220 to apply a second charge signal, CHARGE to the battery 202.

Furthermore, at some point, the temperature throttle signal, TS-THROTTLE and/or the termination signal, TERM may be asserted. Similarly, the data signal, DATA may command disabling of the charge signal, CHARGE. In some of these situations (including any situation where the terminal signal, TERM is asserted), the system 200 changes to a termination state. For example, the temperature throttle signal, TS THROTTLE can trigger the termination state in situations of extreme hot or cold. In the termination state, the controller 224 de-asserts the charge enable signal, CHARGE ENABLE and changes the charge control signal, CHARGE CONTROL. In response, the battery power regulator 220 disables the charge signal, CHARGE until reactivation is requested by the charge command, CHARGE COMMAND.

By utilizing the system 200, transient spikes in the charge signal, CHARGE due to a change in the flow of current through the internal circuitry of the battery power regulator 220 in response to a change in the charge control signal, CHARGE CONTROL are curtailed and/or eliminated. Thus, damage to the battery 202 from such transient spikes is reduced and/or eliminated thereby extending a life of the battery 202. Accordingly, before, during and after a change in the data signal, DATA, the charge signal, CHARGE remains at or below a safety threshold for the battery 202. Moreover, since the charge enable signal, CHARGE ENABLE is de-asserted for a small period of time (e.g., about 1 μs to about 500 ms), the effect on the overall charge time for the battery 202 is negligible.

Figure 6:
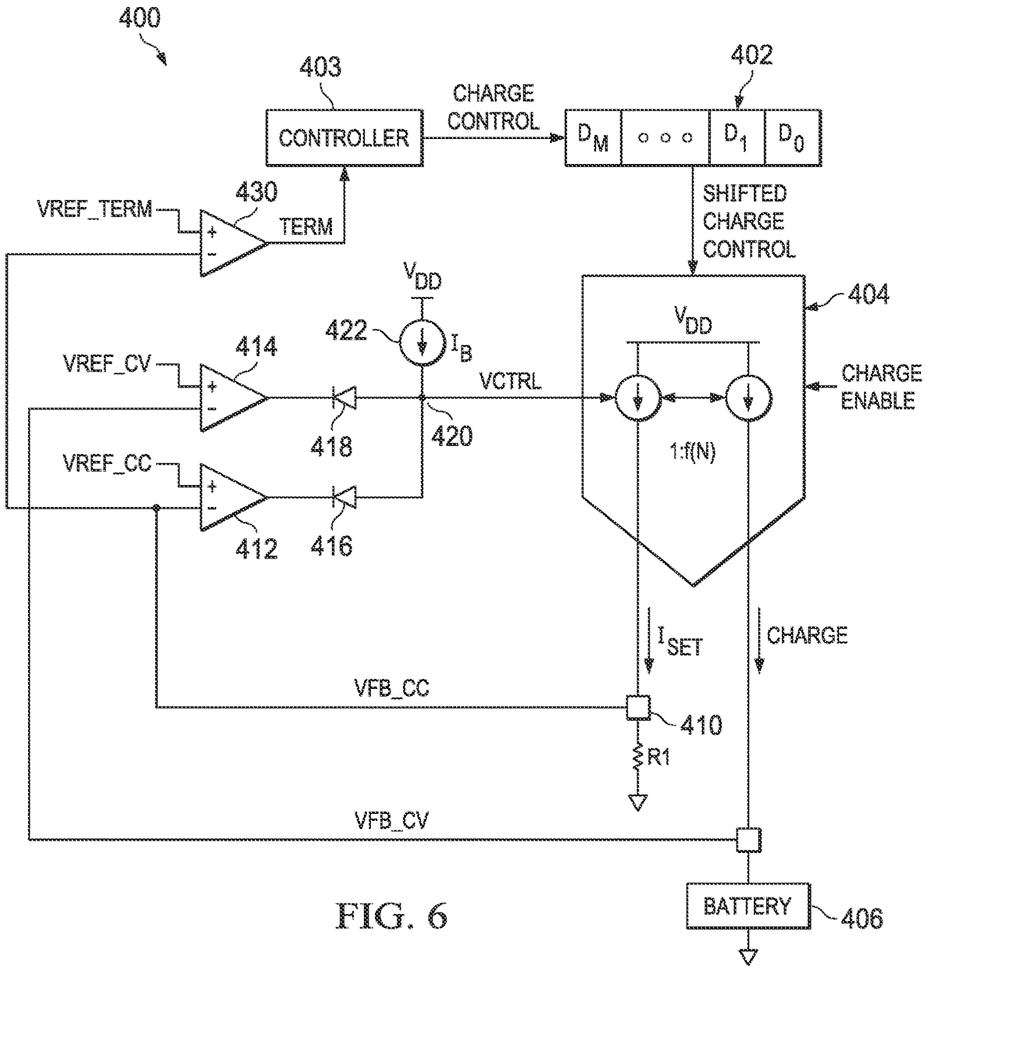
FIG. 6 is a circuit diagram of a battery power regulator.

FIG. 6 illustrates a circuit diagram of a battery power regulator 400 that is employable to implement the battery power regulator 106 of FIG. 1 and/or the battery power regulator 220 of FIG. 3. The battery power regulator 400 receives a shifted control signal, SHIFTED CHARGE CONTROL from a shift registered 402 implemented in a controller 403. The controller 403 is representative of a digital controller, such as the controller 104 of FIG. 1 and/or the controller 224 of FIG. 3. In some examples, the charge control signal, SHIFTED CHARGE CONTROL is an M-bit digital word.

The shift register 402 is adjusted by a charge control signal, CHARGE CONTROL of the controller 403 to generate the shifted charge control signal, SHIFTED CHARGE CONTROL. The shifted charge control signal, SHIFTED CHARGE CONTROL is a constituent component of the charge control signal, CHARGE CONTROL. The shifted charge control signal, SHIFTED CHARGE CONTROL is output to a charge control circuit 404. The charge control circuit 404 is representative of a combination of the DAC 226, the battery FET controller 228 and the transistor array 230 of FIG. 3.

The charge control circuit 404 also receives a charge enable signal, CHARGE ENABLE from the controller 403. The charge control circuit 404 is configured to generate two (2) signals, namely, a charge signal, CHARGE and a feedback current, $I_{SET}$, wherein, the feedback current has current that is a fraction of the charge signal, CHARGE in response to the shifted charge control signal, SHIFTED CHARGE CONTROL and the charge enable signal, CHARGE ENABLE. Moreover, the charge signal, CHARGE is applied to a battery 406 (e.g., the battery 102 of FIG. 1 and/or the battery 202 of FIG. 3).

The feedback current, $I_{SET}$ is applied to a node 410, which node 410 is also coupled to a resistor R1. A voltage at the node 410, namely, a voltage feedback current level, VFB_CC is provided to an inverting input of an operational amplifier (op-amp) 412. Moreover, a voltage reference check current signal, VREF_CC is applied to a non-inverting of the op-amp 412. As noted, the charge signal, CHARGE is applied to the battery 406. Additionally, a voltage at the battery 406, which corresponds to a voltage feedback control voltage, VFB_CV is provided to an inverting input of an operational amplifier (op-amp) 414. Moreover, a reference check voltage signal, VREF_CV is applied to a non-inverting of the op-amp 414. An output of the op-amp 412 is applied to an anode of a diode 416. Similarly, an output of the op-amp 414 is applied to an anode of a diode 418. It is understood that diodes 416 and 418 represent conceptual devices (rather than physical devices) that are a result of a source follower circuit. A cathode of the diodes 416 and 418 are coupled to a node 420. The node 420 is also coupled to a current source 422 that provides a current, IB.

A control voltage, VCTRL at the node 420, is applied to the DAC 404 to adjust the charge signal, CHARGE and the feedback current, $I_{SET}$.

The voltage feedback control current, VFB_CC is also applied to an inverting input of comparator 430. Additionally, a reference voltage termination level, VREF TERM is applied to a non-inverting input of the comparator 430. The comparator 430 outputs a termination signal, TERM to the controller 403. The controller 403 internally adjusts the shift register 402 with the charge control signal, CHARGE CONTROL to generate a shifted charge control signal, SHIFTED CHARGE CONTROL that is output to the charge control circuit 404. It is understood that although the shift register 402 is illustrated as being external to the controller 403, in some examples, the shift register 402 is a data structure implemented within the controller 403.

In operation, the outputs of the op-amps 412 and 414 ensure that the charge signal, CHARGE does not exceed a (threshold) reference voltage and/or current. Similarly, as noted, the termination signal, TERM (via the controller) ensures that the charge enable signal, CHARGE ENABLE is de-asserted if the feedback current signal, $I_{SET}$ exceeds a limit.

Furthermore, the controller 403 adjusts the output of the shift register 402, namely, the shifted charge control, SHIFTED CHARGE CONTROL to ensure that the charge signal, CHARGE substantially matches the current indicated by the charge control signal, CHARGE CONTROL. Further still, the charge control circuit 404 is configured to disable the charge signal, CHARGE and the feedback current signal, $I_{SET}$ if the charge enable signal, CHARGE ENABLE is de-asserted.

Figure 7:
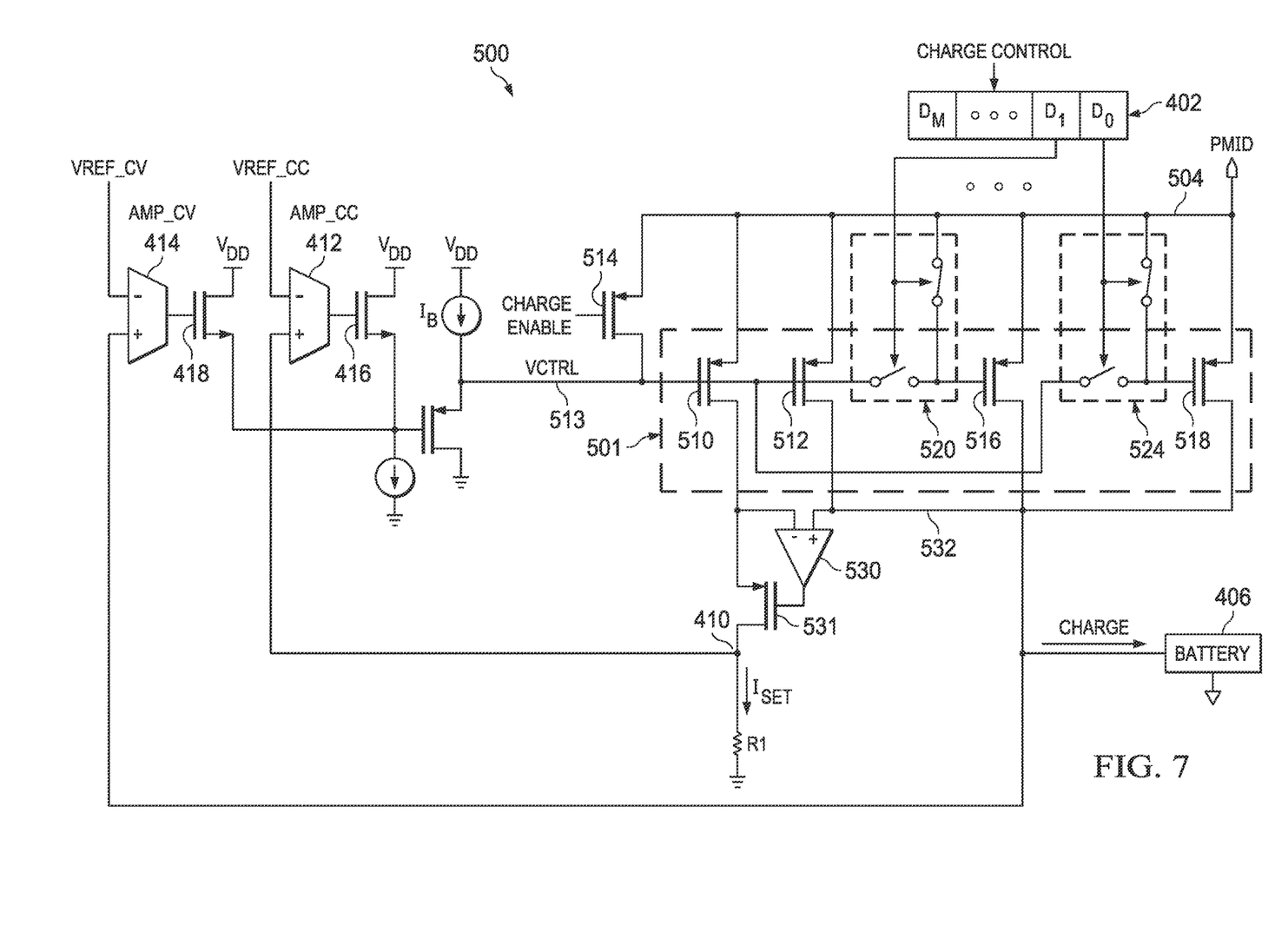
FIG. 7 is a circuit diagram of a battery field effect transistor (FET) control.

FIG. 7 illustrates a circuit diagram of an example of the charge control circuit 500 that is employable to implement the charge control circuit 404 of FIG. 5. For purposes of simplification of explanation, the same reference numbers and signal names are employed throughout FIGS. 3-7 to denote the same structures without further discussion.

The charge control circuit 500 includes a PMOS array 501, which correspond to the transistor array 230 of FIG. 3. There are M+1 PMOSs in the PMOS array 501, where the shift register 402 receives an M-bit charge control signal, CHARGE CONTROL. A source of each PMOS in the PMOS array 501 is coupled to a node 504. The mid-point voltage PMID, illustrated in FIG. 3 is applied to the node 504. A source of a first PMOSs 510 (a feedback transistor) and a source a of a second PMOS 512 in the PMOS array 501 have a gate coupled to a control voltage node 513 that is energized by the voltage control signal, VCTRL. The control voltage node 513 is also coupled to a drain of a charge enable PMOS 514.

In the example illustrated, the PMOS array 501 also includes a third PMOS 516 and a fourth PMOS 518. However, in other examples, there could be more or less PMOSs in the PMOS array 501. A gate of the third PMOS 516 is coupled to a corresponding pair of complementary switches 520. The pair of complementary switches 520 are elements of a switch network. In general, in the switch network each complementary pairs of switches is arranged to control bias of a control node (e.g., a gate) of a corresponding transistor (e.g., a PMOS) in the transistor array (e.g., the PMOS array 501). More particularly, a first switch in each pair of complementary switches is coupled to the node 504 and a gate of a corresponding PMOS in the PMOS array 501. Additionally, a second switch of each pair of complementary switches is coupled to the control voltage node 513 and a gate of a corresponding PMOS in the PMOS array 501. More particularly, the pair of complementary switches 520 control a state of the third PMOS 516 based on a corresponding bit in the shifted charge control signal (SHIFTED CHARGE CONTROL in FIG. 6). Specifically, in a situation where the corresponding bit (bit 1) is a logical 0 (e.g., a low voltage signal), the switch connecting the gate of the third PMOS 516 to the node 504 is closed and the switch connecting the gate of the third PMOS 516 to the control voltage node 513 is opened, thereby turning the third PMOS 516 off. Conversely, in a situation where the corresponding bit (bit 1) is a logical 1 (e.g., a high voltage signal), the switch connecting the gate of the third PMOS 516 to the node 504 is opened and the switch connecting the gate of the third PMOS 516 to the control voltage node 513 is closed, thereby allowing the control voltage, VCTRL to control the state of the third PMOS 516.

Similarly, a gate of the fourth PMOS 518 is coupled to a corresponding pair of complementary switches 524. The state of the pair of complementary switches 524 is controlled by the state of the 0th bit (least significant bit) of the shifted charge control signal (SHIFTED CHARGE CONTROL in FIG. 6), in a manner similar to the states of the pair of complementary switches 520 to control a state of the fourth PMOS 518.

A source of the charge enable PMOS 514 is coupled to the node 504, and a gate of the charge enable PMOS 514 is controlled by the charge enable signal, CHARGE ENABLE. Accordingly, assertion (e.g., a high voltage signal) of the charge enable signal, CHARGE ENABLE causes the charge enable PMOS 514 to operate in the cut-off region, such that the charge enable PMOS 514 is turned off. Conversely, de-assertion (e.g., a low voltage signal) of the charge enable signal, CHARGE ENABLE causes the charge enable PMOS 514 to operate in the linear region, such that the charge enable PMOS 514 is turned-on, thereby driving a gate to source voltage ($V_{GS}$) of the first PMOS 510 and the second PMOS 512 of the PMOS array 501 to about 0 V, thereby turning (or keeping) first PMOS 510 and the second PMOS 512 off. Further, in a situation where the third PMOS 516 and/or the fourth PMOS 518 is turned on, de-assertion of the charge enable signal, CHARGE ENABLE turns the third PMOS 516 and/or the fourth PMOS 518 off independent of the state of the corresponding bit in the shifted charge control signal (SHIFTED CHARGE CONTROL in FIG. 6) and/or the control voltage, VCTRL.

Furthermore, a drain of the first PMOS 510 is coupled to an inverting input of an op-amp 530 and a source of a PMOS 531. A drain of the second PMOS 512, the third PMOS 516 and the fourth PMOS 518 are coupled to a charging node 532, which is also coupled to a non-inverting input of the op-amp 530. More generally, an output node (e.g., a drain) of a subset of transistors (e.g., the second PMOS 512, the third PMOS 516 and the fourth PMOS 518) in the transistor array (the PMOS array 501) is coupled to the charging node 532. The charging node 532 is coupled to the battery 406 and to the non-inverting input of the op-amp 414 (described with respect to FIG. 6). An output of the op-amp 530 is coupled to a gate of the PMOS 531. A drain of the PMOS 531 is coupled to the node 410 that provides the feedback current, $I_{SET}$ and the voltage feedback control current, VFB_CC to the op-amp 412 explained in detail with respect to FIG. 7.

In operation, the value of the shifted charge control signal (SHIFTED CHARGE CONTROL in FIG. 6), controls the number of PMOSs the in the PMOS array 501 that are turned on, which controls the charge signal, CHARGE to the battery 406. Furthermore, the voltage level at the voltage control node 513, corresponding to the voltage control signal, VCTRL at least partially controls a gate voltage of each PMOS in the PMOS array 501. Moreover, as explained with respect to FIG. 3-5, in situations where the value of the charge control signal, CHARGE CONTROL changes (propagating a change in the shifted charge control signal (SHIFTED CHARGE CONTROL in FIG. 6)), the charge enable signal, CHARGE ENABLE is temporarily de-asserted for a predetermined amount of time (e.g., about 0.5 ms to about 1 ms). After the de-assertion of the charge enable signal, CHARGE ENABLE During this predetermined amount of time, the current of the charge signal, CHARGE drops to a level near 0 A (e.g., +/−0.001 A) and the pairs of complementary switches 520 change state (if needed) based on the changed value of the shifted charge control signal (SHIFTED CHARGE CONTROL in FIG. 6). Upon the charge enable signal, CHARGE ENABLE being reasserted, the charge signal, CHARGE is set to the level indicated by the updated charge control signal, CHARGE CONTROL. Accordingly, transient spikes that would otherwise occur in the current of the charge signal, CHARGE due to a change in the states of the switches in the switch network are curtailed or eliminated. Instead, before, during and after a change in charge control signal, CHARGE CONTROL, the charge signal, CHARGE remains at or below a safety threshold for the battery 406.

Figure 8:
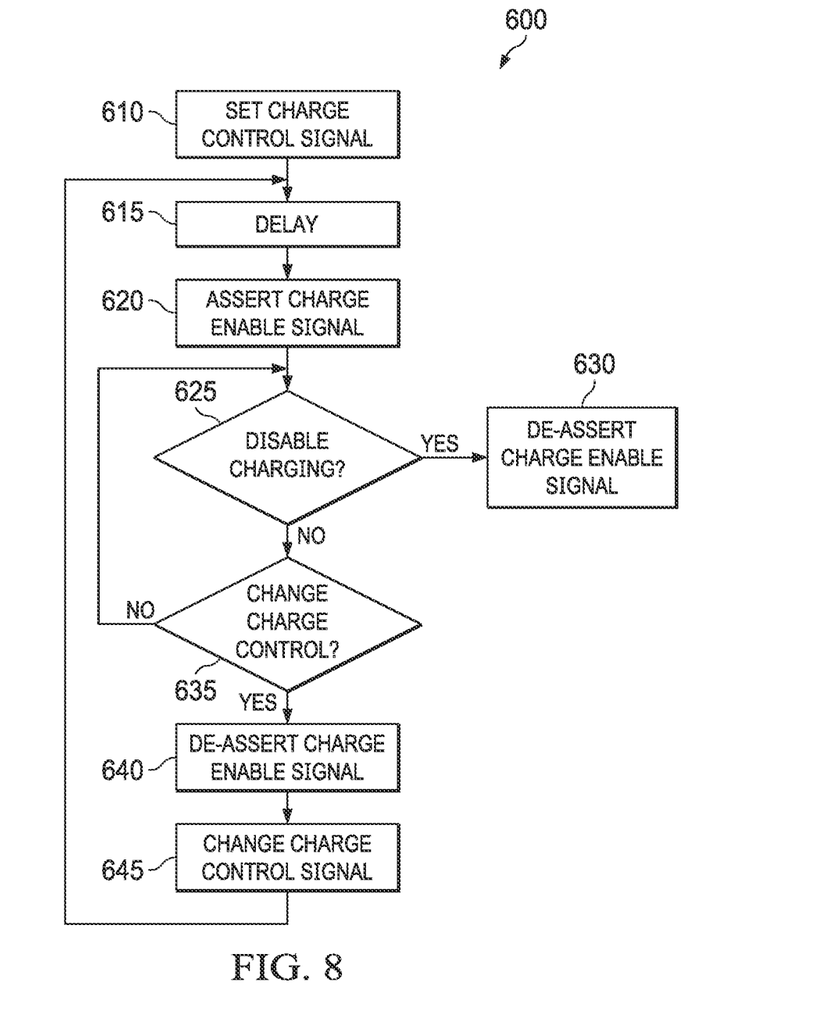
FIG. 8 is a flow chart of an example method for charging a battery.

FIG. 8 illustrates a flowchart of an example method 600 for charging a battery. In some examples, the method 600 is implemented by the system 100 of FIG. 1 and/or the system 200 of FIG. 3. At 610, a controller (e.g., the controller 104 of FIG. 1) sets a charge control signal that is applied to a battery power regulator (e.g., the battery power regulator 106 of FIG. 1). In some examples, the charge control signal is set based on a charge command signal from an external source. In other examples, the charge control signal is set based on internal logic of the controller 104.

At 615, the controller applies a delay (e.g., based on a timer) for a predetermined amount of time (e.g., about 0.5 ms to about 1 ms). At 620, the controller asserts a charge enable signal to the battery power regulator 106. The charge enable signal, along with the charge control signal, causes the battery power regulator to apply a charge signal to a battery (e.g., the battery 102 of FIG. 1). Moreover, application of the delay at 615 allows the battery power regulator 106 to adjust internal switching to avoid transient spikes in the charge signal.

At 625, the controller makes a determination as to whether charging of the battery should be disabled. The determination at 625 is based on a determination by an external system that the battery is fully charged, a threshold temperature has been exceeded and/or a threshold voltage or current has been exceeded. If the determination at 625 is positive (e.g., YES), the method 600 proceeds to 630. If the determination at 625 is negative (e.g., NO), the method 600 proceeds to 635. At 630, the controller de-asserts the charge enable signal, thereby causing the battery power regulator 106 to disable the charge signal, thereby reducing the current of the charge signal to a level near 0 A (e.g., +/−0.001 A).

At 635, a determination is made by the controller whether to change the charge control signal. The determination at 635 is based on a determination that the charge signal for the battery is to change from a pre-charge level to a fast charge level. If the determination at 635 is negative (e.g., NO), the method 600 returns to 625. If the determination at 635 is positive (e.g., YES), the method 600 proceeds to 640. At 640, the controller de-asserts the charge enable signal, thereby causing the battery power regulator to disable the charge signal such that the battery power regulator reduces the current of the charge signal to a level near 0 A (e.g., +/−0.001 A). At 645, the controller changes the charge control signal. Changing the charge control signal causes adjustments to the internal circuits (e.g., switches) of the battery power regulator 106 to change the charge signal, and the method 600 returns to 615. As is demonstrated in the method 600, prior to assertion of the charge enable signal (at 620), the battery power regulator is given time (in the delay 615) to adjust internal circuitry (e.g., switches) to prevent unwanted transient spikes in the charge signal that would otherwise damage the battery. Moreover, as is illustrated, throughout a charging cycle of the battery, the charge control signal can be adjusted multiple times. That is, the method 600 is illustrated as including two loops that are repeatedly executed until charging is to be disabled (at 625).

Figure 9:
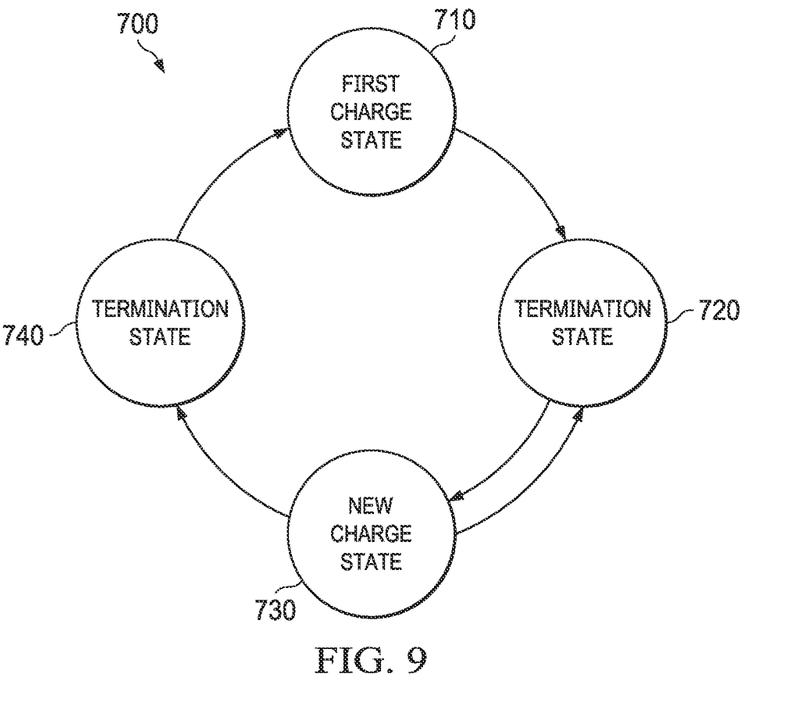
FIG. 9 is a state diagram of an example system for charging a battery.

FIG. 9 illustrates a state diagram of a system 700 for charging a battery that avoids transient spikes in a current of a charge signal. The system 700 is representative of the system 100 of FIG. 1 and/or the system 200 of FIG. 3. In a first charging state 710, the battery (e.g., the battery 102 of FIG. 1) is charged at a first level by a battery power regulator (e.g., the battery power regulator 106 of FIG. 1). In the first charging state 710, the battery power regulator sets a charge signal to a first level for the battery based on a charge control signal and assertion of a charge enable signal from a controller.

The system 700 changes to a transition state 720 in response to determining that a change in the charge signal is needed. In the transition state, the charge enable signal is de-asserted by the controller for a predetermined amount of time (e.g., 10 μs to about 500 ms), thereby causing the battery power regulator to disable the charge signal, such that the current of the charge signal is reduced to near 0 A (e.g., +/−0.001 A). Additionally, in the transition state, the controller changes the charge control signal, which in turn causes the battery power regulator to adjust internal switches while keeping the current of the charge signal at near 0 A (e.g., +/−0.001 A).

The system 700 changes to a new charging state 730 in response to the controller re-asserting the charge enable signal. In the new charging state 730, the battery power regulator applies a changed charge signal to the battery based on the changes to the charge control signal. Additionally, since the adjustment of the internal switches is executed while the current of the charge signal is near 0 A (e.g., +/−0.001 A), transient spikes in the charge signal due to such adjustment are curtailed and/or avoided.

The system 700 changes back to the transition state 720 in response to determining that a second (or subsequent) change in the charge signal is needed and the charge enable signal is de-asserted (again) by the controller for a predetermined amount of time (e.g. 10 μs to about 500 ms). Upon executing operations in the transition state, the system changes to a second (or subsequent) instance of the new charging state 730 in response to the controller re-asserting the charge enable signal. Thus, based on the charging needs of the battery and/or environmental factors, in some examples, the system 700 repeatedly changes (e.g., loops) between the transition state 720 and the new charging state 730.

Further, the system 700 changes to a termination state 740 in response to a determination that the battery is no longer to be charged (e.g., the battery is full, a temperature threshold is exceed and/or a voltage or current threshold is exceeded). In the termination state, the charge enable signal is de-asserted, thereby causing the battery power regulator to disable the charge signal, such that the current of the charge signal is reduced to near 0 A (e.g., +/−0.001 A). Additionally, the charge control signal is adjusted to indicate that the current of the charge signal is to be set to a level near 0 A (e.g., +/−0.001 A). The system 700 remains in the termination state 740 until the battery is to be charged again, at which point the system 700 returns to the first charge state 710.

Figure 10:
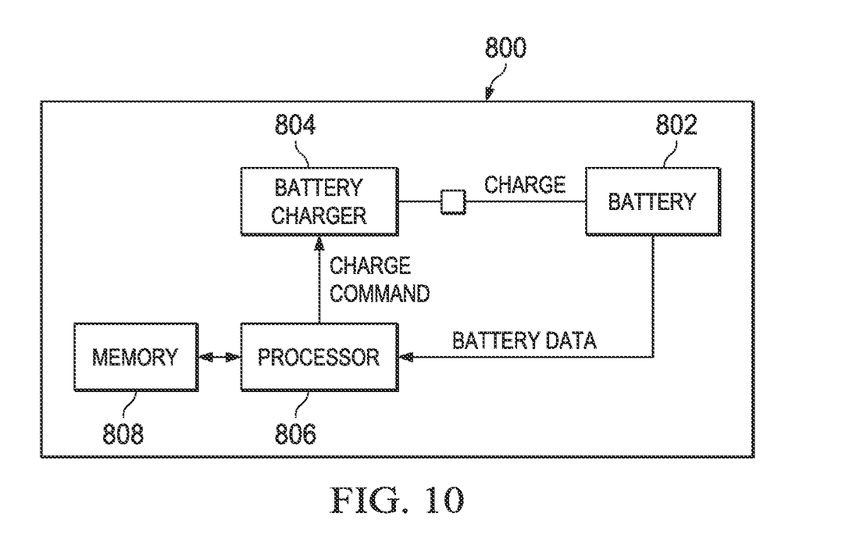
FIG. 10 is a diagram of a device that charges a battery.

FIG. 10 illustrates an example of an electronic device 800 that charges a battery 802 and avoids transient spikes in a current of a charge signal. In some examples, the electronic device 800 is implemented as a smart phone. In other examples, the electronic device 800 is implemented as a battery operated IoT device. The battery 802 is charged with a battery charger 804. In some examples, the battery charger 804 is implemented with the system 100 of FIG. 1 and/or the system 200 of FIG. 3. The mobile device 800 also includes a processor 806 that is representative of the external system described with respect to FIGS. 1 and 3.

The processor 806 accesses a memory 808 that stores machine executable instructions. The memory 808 is a non-transitory machine readable medium, such as volatile memory (e.g., random access memory (RAM)), non-volatile memory (e.g., flash memory or a hard disk drive) or a combination thereof. In some examples, the processor 806 is implemented as a general purpose processor that includes one or more processor cores.

The processor 806 generates a charge command signal, CHARGE COMMAND base on battery data, BATTERY DATA collected by the processor 806. More particularly, the charge command signal, CHARGE COMMAND is controlled based on a battery protocol for the battery 802.

In response to the charge command signal, CHARGE COMMAND the battery charger 804 generates a charge signal, CHARGE that remains at or below a safety threshold for the battery 802. More particularly, in situations where the charge signal, CHARGE is changed (e.g., due to a change in the charge command signal, CHARGE COMMAND, prior to changing, the charge signal, CHARGE is temporarily disabled allowing internal circuitry (e.g., switches) of the battery charger 804 to be adjusted. Moreover, the charge signal, CHARGE is re-enabled after the adjustments to the internal circuitry of the battery charger 804 to curtail and/or avoid transient spikes in the charge signal, CHARGE.

Figure 11:
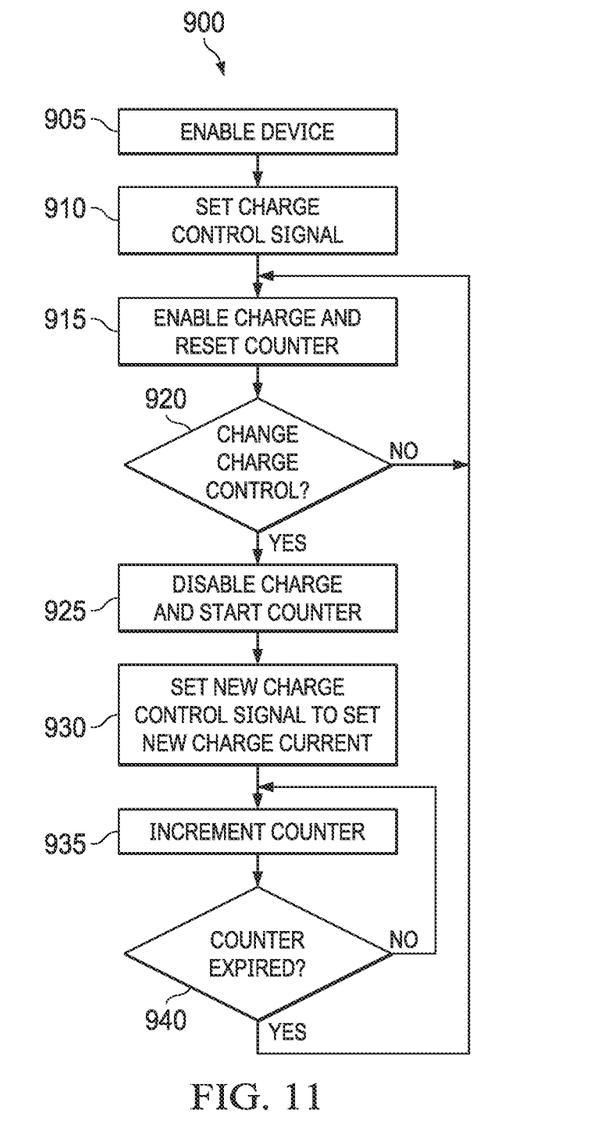
FIG. 11 is a flow chart of another example method for charging a battery.

FIG. 11 illustrates a flowchart of another example method 900 for charging a battery that avoids transient spikes in a current of a charge signal. In some examples, the method 900 is implemented by the system 100 of FIG. 1 and/or the system 200 of FIG. 3. At 905 an electronic device powered by a battery (e.g., the battery 102 of FIG. 1) is enabled. At 910, a controller (e.g., the controller 104 of FIG. 1) sets a charge control signal that is applied to a battery power regulator (e.g., the battery power regulator 106 of FIG. 1). In some examples, the charge control signal is set based on a charge command signal from an external source. In other examples, the charge control signal is set based on internal logic of the controller.

At 915, a charge enable signal is enabled (asserted) and a counter maintained by the controller is reset. At 920, the controller makes a determination as to whether a change in the charge control signal is needed. The determination at 920 is based on a determination by an external system that the battery is fully charged, a threshold temperature has been exceeded and/or a threshold voltage or current has been exceeded. If the determination at 920 is negative (e.g., NO), the method 900 returns to 915. If the determination at 920 is positive (e.g., YES), the method 900 proceeds to 925.

At 925, the controller disables charging of the battery and starts the counter. More particularly, to disable the charging of the battery, the controller de-asserts the charge enable signal, causing the battery power regulator 106 to disable the charge signal, thereby reducing the current of the charge signal to a level near 0 A (e.g., +/−0.001 A). Moreover, the timer can be set to measure a predetermined amount of time (e.g., about 0.5 ms to about 1 ms). At 930, the controller sets a new charge control signal to cause the power regulator to sets a new current of the charge signal in response to the new change control signal. Changing the charge control signal causes adjustments to the internal circuits (e.g., switches) of the battery power regulator 106 to change the current of the charge signal. At 935, the controller increments the counter.

At 940, the controller makes a determination as to whether the counter has expired. If the determination at 940 is positive (e.g., YES), the method 900 returns to 915. If the determination at 940 is negative (e.g., NO), the method 900 returns to 935.

As is demonstrated in the method 900, prior to assertion of the charge enable signal (at 915), the battery power regulator is given time to adjust internal circuitry (e.g., switches) to prevent unwanted transient spikes in the charge signal that would otherwise damage the battery. Moreover, as is illustrated, throughout a charging cycle of the battery, the charge control signal can be adjusted multiple times. That is, the method 900 is illustrated as including two loops that are repeatedly executed.

What is claimed is:

1. A battery charger comprising:
a power regulator configured to provide a charge signal at a charge signal terminal responsive to a charge control signal and a charge enable signal, wherein the charge signal is a multibit digital signal, and the power regulator includes a digital to analog converter (DAC) configured to convert the charge control signal into the charge signal and a feedback signal, the DAC including a switch network configured to control a transistor array, wherein an output terminal of a subset of transistors in the transistor array is coupled to the charge signal terminal; and
a controller that includes a shift register configured to receive the multibit digital signal and provide a shifted multibit digital signal, the controller being configured to:
provide the charge control signal to the power regulator;
temporarily de-assert the charge enable signal in response to determining that a change is needed in the charge control signal;
change the charge control signal in response to the de-asserting; and
re-assert the charge enable signal following a particular amount of time after changing the charge control signal;
wherein a subset of bits in the shifted multibit digital signal controls switches in the switch network that control a state of transistors of the transistor array.

2. The battery charger of claim 1, wherein the transistor array includes a feedback transistor configured to provide the feedback signal, and the feedback signal has a feedback current that is a fraction of a current of the charge signal.

3. The battery charger of claim 2, wherein the feedback signal is configured to control the shift register to adjust the shifted multibit digital signal.

4. The battery charger of claim 1, wherein the particular amount of time is in a range between 10 microseconds and 500 milliseconds.

5. The battery charger of claim 1, wherein a current of the charge signal is at or below a safety threshold before, during and after the controller changes the charge control signal.

6. The battery charger of claim 1, wherein the charge control signal is responsive to a command signal received at the controller.

7. The battery charger of claim 6, wherein the command signal includes a data signal provided on a data bus.

8. The battery charger of claim 1, wherein the battery charger is included in a mobile device.

9. A system comprising:
a power regulator configured to provide power for charging a battery;
a battery power regulator configured to:
receive the power for charging the battery;
provide a charge signal to a battery at a charge signal terminal responsive to a charge control signal and a charge enable signal; and
a controller configured to:
provide the charge control signal and a charge enabled signal to the battery power regulator responsive to a charge command signal received at the controller;
temporarily de-assert the charge enable signal for a particular amount of time in response to the charge command signal commanding a change in the charge control signal, wherein the charge signal is disabled by the battery power regulator responsive to de-assertion of the charge enable signal;
change the charge control signal responsive to the change in the charge command signal; and
re-assert the charge enable signal following the particular amount of time, wherein the re-assertion causes the battery power regulator to re-enable the charge signal.

10. The system of claim 9, wherein the charge control signal is a multibit digital signal, and the battery power regulator includes a digital to analog converter (DAC) configured to convert the charge control signal into the charge signal and a feedback signal.

11. The system of claim 10,
wherein the controller includes a shift register configured to receive the multibit digital signal and generate a shifted multibit digital signal; and
wherein the DAC includes a switch network configured to control a transistor array, wherein an output terminal of a subset of transistors in the transistor array is coupled to the charge signal terminal, and a subset of bits in the shifted multibit digital signal controls switches in the switch network that control a state of transistors of the transistor array.

12. The system of claim 11, wherein the switch network includes complementary pairs of switches that are arranged to control bias of a control terminal of a respective transistor in the transistor array.

13. The system of claim 11, wherein the feedback signal is configured to control the shift register to adjust the shifted multibit digital signal.

14. The system of claim 9, wherein the particular amount of time is in a range between 10 microseconds and 500 milliseconds.

15. The system of claim 9, wherein a current of the charge signal is at or below a safety threshold before, during and after the controller changes the charge control signal.

16. A method for charging a battery comprising:
applying, by a battery power regulator, a first charge signal to a battery at a first charge signal terminal in response to a charge control signal and assertion of a charge enable signal;
determining, by a controller, that the charge control signal is to change;
de-asserting, by the controller, the charge enable signal responsive to the determining, thereby causing the battery power regulator to disable the first charge signal;
changing, by the controller, the charge control signal in response to the de-asserting;
re-asserting, by the controller, the charge enable signal a particular amount of time after the changing; and
applying, by the battery power regulator, a second charge signal to the battery responsive to the changed charge control signal and the re-assertion of the charge enable signal.

17. The method of claim 16, wherein the particular amount of time is in a range between 10 microseconds and 500 milliseconds.

18. The method of claim 16, wherein a current of the first charge signal and a current of the second charge signal are at or below a safety threshold before, during and after changing the charge control signal.

* * * * *